(12) United States Patent
Lai et al.

(10) Patent No.: US 12,334,489 B2
(45) Date of Patent: Jun. 17, 2025

(54) LTHC AS CHARGING BARRIER IN INFO PACKAGE FORMATION

(71) Applicant: Taiwan Semiconductor Manufacturing Co., Ltd., Hsinchu (TW)

(72) Inventors: Yi-Jen Lai, Hsinchu (TW); Chung-Yi Lin, Hsinchu (TW); Hsi-Kuei Cheng, Zhubei (TW); Chen-Shien Chen, Zhubei (TW); Kuo-Chio Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/425,389

(22) Filed: Jan. 29, 2024

(65) Prior Publication Data

US 2024/0222352 A1    Jul. 4, 2024

Related U.S. Application Data

(60) Division of application No. 17/874,492, filed on Jul. 27, 2022, now Pat. No. 11,923,353, which is a
(Continued)

(51) Int. Cl.
*H01L 25/00* (2006.01)
*H01L 21/56* (2006.01)
(Continued)

(52) U.S. Cl.
CPC ............ *H01L 25/50* (2013.01); *H01L 21/561* (2013.01); *H01L 21/6835* (2013.01); *H01L 21/6836* (2013.01); *H01L 23/60* (2013.01); *H01L 24/02* (2013.01); *H01L 24/96* (2013.01); *H01L 25/105* (2013.01); *H01L 23/3128* (2013.01); *H01L 24/13* (2013.01); *H01L 24/16* (2013.01);
(Continued)

(58) Field of Classification Search
None
See application file for complete search history.

(56) References Cited

U.S. PATENT DOCUMENTS

| | | | |
|---|---|---|---|
| 7,759,050 B2 | 7/2010 | Kessel et al. | |
| 8,361,842 B2 | 1/2013 | Yu et al. | |

(Continued)

FOREIGN PATENT DOCUMENTS

| | | | |
|---|---|---|---|
| CN | 101489789 A | 7/2009 | |
| CN | 105225967 A | 1/2016 | |

(Continued)

*Primary Examiner* — Erik Kielin
(74) *Attorney, Agent, or Firm* — Slater Matsil, LLP

(57) ABSTRACT

A method includes forming a release film over a carrier, forming a polymer buffer layer over the release film, forming a metal post on the polymer buffer layer, encapsulating the metal post in an encapsulating material, performing a planarization on the encapsulating material to expose the metal post, forming a redistribution structure over the encapsulating material and the metal post, and decomposing a first portion of the release film. A second portion of the release film remains after the decomposing. An opening is formed in the polymer buffer layer to expose the metal post.

20 Claims, 23 Drawing Sheets

Related U.S. Application Data continuation of application No. 16/569,078, filed on Sep. 12, 2019, now Pat. No. 11,437,361, which is a division of application No. 15/907,409, filed on Feb. 28, 2018, now Pat. No. 10,522,526.

(60) Provisional application No. 62/538,192, filed on Jul. 28, 2017.

(51) Int. Cl.

| | | |
|---|---|---|
| *H01L 21/683* | (2006.01) | |
| *H01L 23/00* | (2006.01) | |
| *H01L 23/31* | (2006.01) | |
| *H01L 23/60* | (2006.01) | |
| *H01L 25/065* | (2023.01) | |
| *H01L 25/10* | (2006.01) | |
| *H01L 25/18* | (2023.01) | |

(52) U.S. Cl.
CPC .......... *H01L 25/0657* (2013.01); *H01L 25/18* (2013.01); *H01L 2221/68331* (2013.01); *H01L 2221/68345* (2013.01); *H01L 2221/68359* (2013.01); *H01L 2221/68377* (2013.01); *H01L 2221/68381* (2013.01); *H01L 2224/02311* (2013.01); *H01L 2224/02319* (2013.01); *H01L 2224/02331* (2013.01); *H01L 2224/02372* (2013.01); *H01L 2224/02375* (2013.01); *H01L 2224/02379* (2013.01); *H01L 2224/02381* (2013.01); *H01L 2224/04105* (2013.01); *H01L 2224/06182* (2013.01); *H01L 2224/12105* (2013.01); *H01L 2224/13024* (2013.01); *H01L 2224/16146* (2013.01); *H01L 2224/18* (2013.01); *H01L 2224/32145* (2013.01); *H01L 2224/32225* (2013.01); *H01L 2224/48227* (2013.01); *H01L 2224/73265* (2013.01); *H01L 2224/73267* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01); *H01L 2924/181* (2013.01)

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,800,631 B2 | 8/2014 | Noda et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 11,437,361 B2 * | 9/2022 | Lai ........ H01L 21/561 |
| 2001/0035588 A1 | 11/2001 | Aga |
| 2002/0158334 A1 | 10/2002 | Vu et al. |
| 2004/0192024 A1 | 9/2004 | Ito |
| 2011/0291288 A1 | 12/2011 | Wu et al. |
| 2012/0043648 A1 | 2/2012 | Matsumaru et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0130962 A1 | 5/2014 | Yu et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0102502 A1 | 4/2015 | Chiu et al. |
| 2015/0348904 A1 | 12/2015 | Huang et al. |
| 2015/0348912 A1 | 12/2015 | Su et al. |
| 2015/0380340 A1 | 12/2015 | Cheng et al. |
| 2016/0035666 A1 | 2/2016 | Huang et al. |
| 2016/0071820 A1 | 3/2016 | Yu et al. |
| 2016/0101613 A1 | 4/2016 | Shih et al. |
| 2016/0148903 A1* | 5/2016 | Su ............ H01L 21/486 |
| | | 257/737 |
| 2016/0163564 A1 | 6/2016 | Yu et al. |
| 2016/0211217 A1 | 7/2016 | Tino et al. |
| 2016/0276248 A1 | 9/2016 | Huang et al. |
| 2016/0284582 A1 | 9/2016 | Dang et al. |
| 2016/0351494 A1 | 12/2016 | Chen et al. |
| 2017/0032977 A1 | 2/2017 | Chen et al. |
| 2017/0059514 A1* | 3/2017 | Hoffman ............ G01N 33/5438 |
| 2017/0077807 A1 | 3/2017 | Cruz et al. |
| 2017/0170128 A1 | 6/2017 | Chen et al. |
| 2017/0194186 A1 | 7/2017 | Andry et al. |
| 2017/0221820 A1 | 8/2017 | Yu et al. |
| 2017/0287782 A1 | 10/2017 | Dang et al. |

FOREIGN PATENT DOCUMENTS

| | | |
|---|---|---|
| CN | 106409810 A | 2/2017 |
| JP | 2004064040 A | 2/2004 |
| KR | 20160001586 A | 1/2016 |
| KR | 101750143 B1 | 6/2017 |

* cited by examiner

LTHC AS CHARGING BARRIER IN INFO PACKAGE FORMATION

PRIORITY CLAIM AND CROSS-REFERENCE

This application is a divisional of U.S. application Ser. No. 17/874,492, filed on Jul. 27, 2022, which is a continuation of U.S. application Ser. No. 16/569,078, filed on Sep. 12, 2019, now U.S. Pat. No. 11,437,361, issued on Sep. 6, 2022, which is a divisional of U.S. application Ser. No. 15/907,409, filed Feb. 28, 2018, now U.S. Pat. No. 10,522,526, issued on Dec. 31, 2019, which claims the benefit of the following provisionally filed U.S. Application No. 62/538,192, filed Jul. 28, 2017, which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 18A illustrate the cross-sectional views of intermediate stages in the formation of a package in accordance with some embodiments.

DETAILED DESCRIPTION

Figure 1:
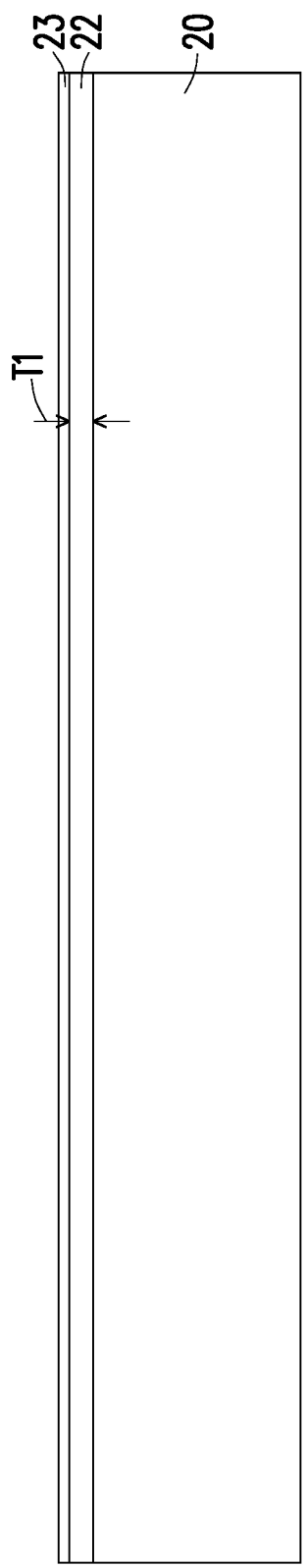

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package and the method of forming the same are provided in accordance with various exemplary embodiments. The intermediate stages of forming the InFO package are illustrated in accordance with some embodiments. Some variations of some embodiments are discussed. Throughout the various views and illustrative embodiments, like reference numbers are used to designate like elements.

FIGS. 1 through 18A illustrate the cross-sectional views of intermediate stages in the formation of a package in accordance with some embodiments. The steps shown in FIG. 1 through 18A are also illustrated schematically in the process flow 400 shown in FIG. 21.

Referring to FIG. 1, carrier 20 is provided, and release film 22 is coated on carrier 20. The respective step is illustrated as step 402 in the process flow shown in FIG. 21. Carrier 20 is formed of a transparent material, and may be a glass carrier, a ceramic carrier, an organic carrier, or the like. Carrier 20 may have a round top-view shape, and may have a size of a silicon wafer. For example, carrier 20 may have an 8-inch diameter, a 12-inch diameter, or the like. Release film 22 is in physical contact with the top surface of carrier 20. Release film 22 may be formed of a Light To Heat Conversion (LTHC) coating material. Release film 22 may be applied onto carrier 20 through coating. In accordance with some embodiments of the present disclosure, the LTHC coating material is capable of being decomposed under the heat of light/radiation (such as laser), and hence can release carrier 20 from the structure formed thereon. In accordance with some embodiments of the present disclosure, LTHC coating material 22 includes carbon black (carbon particles that have the black color), a solvent, a silicon filler, and/or an epoxy. The epoxy may include Acrylic or another polymer such as polyimide. The polyimide, if included in the LTHC coating material, is different from the typical polyimide that is used for photolithography since it is no longer light-sensitive, and may not be removed through photo exposure and development. The thickness T1 of LTHC coating material 22 may be greater than about 1 µm, and may be in the range between about 1 µm and about 2.5 µm in accordance with some exemplary embodiments of the present disclosure. The thickness T1 is discussed in detailed in subsequent paragraphs. It is appreciated that the values recited throughout the description of the present disclosure are examples, and may be changed to different values. LTHC coating material 22 may be coated in a flowable form, and is then cured, for example, under ultra-violet (UV) light. LTHC coating material 22 is a homogenous material, and the top and the bottom portions of the entire LTHC coating material 22 have the same composition.

In accordance with some embodiments, as also shown in FIG. 1, polymer buffer layer 23 is formed on LTHC coating material 22. The respective step is also illustrated as step 402 in the process flow shown in FIG. 21. In accordance with some embodiments, polymer buffer layer 23 is formed of polybenzoxazole (PBO), polyimide, benzocyclobutene (BCB), or another applicable polymer.

Figure 2:
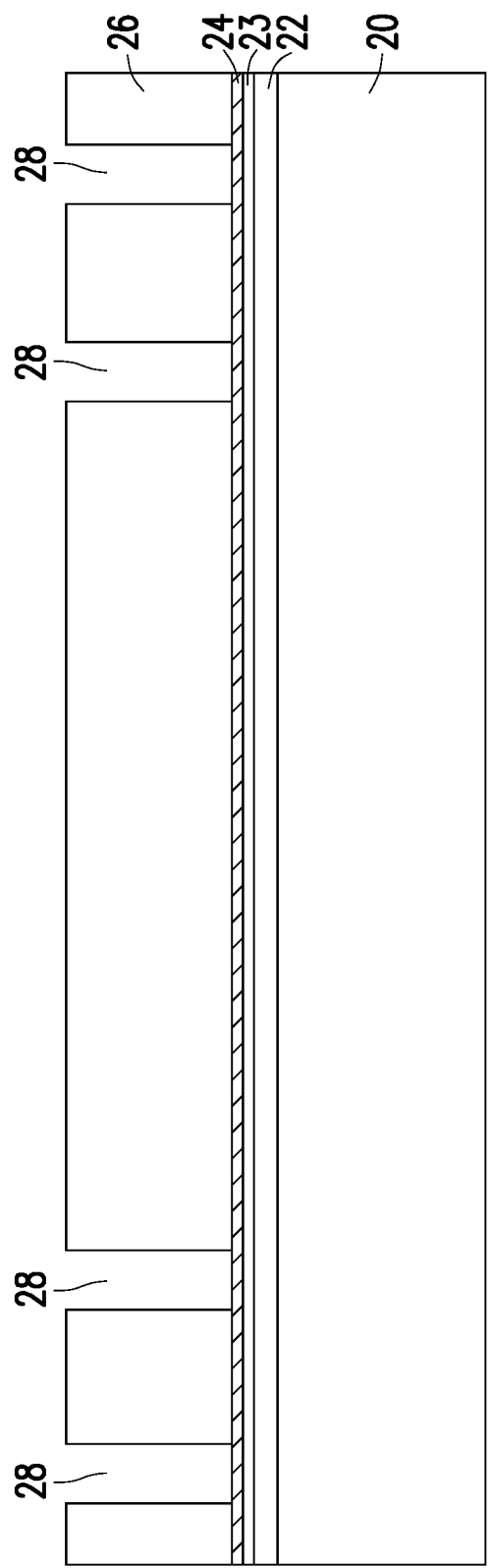
Figure 3:
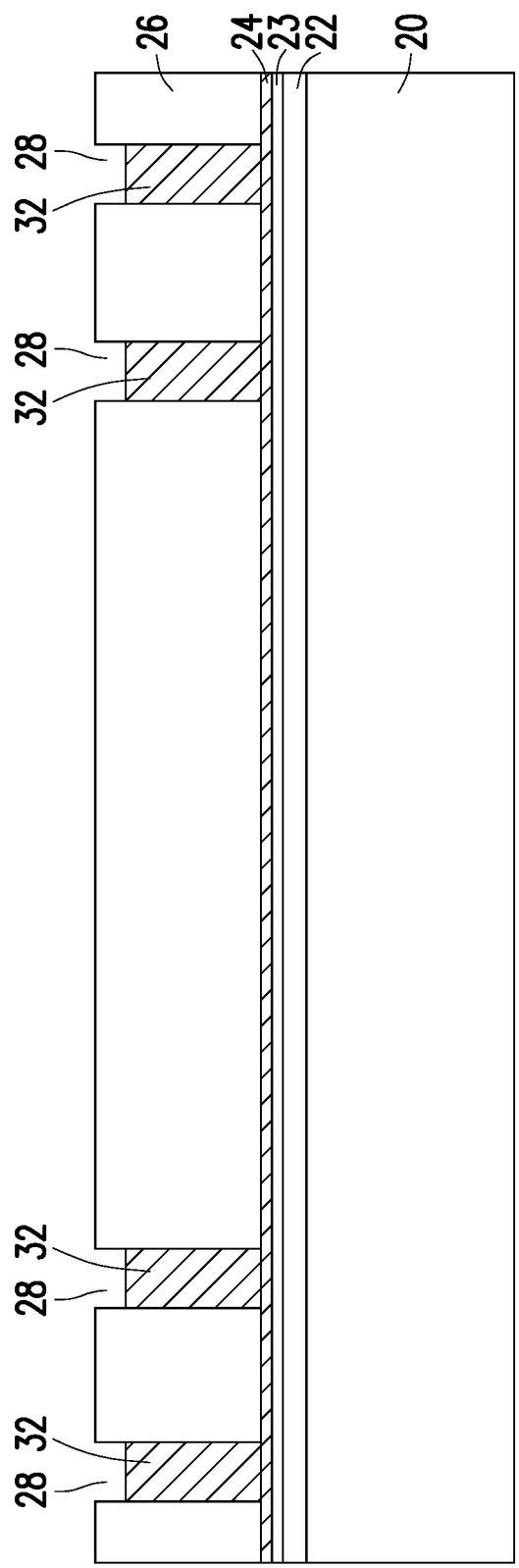
Figure 4:
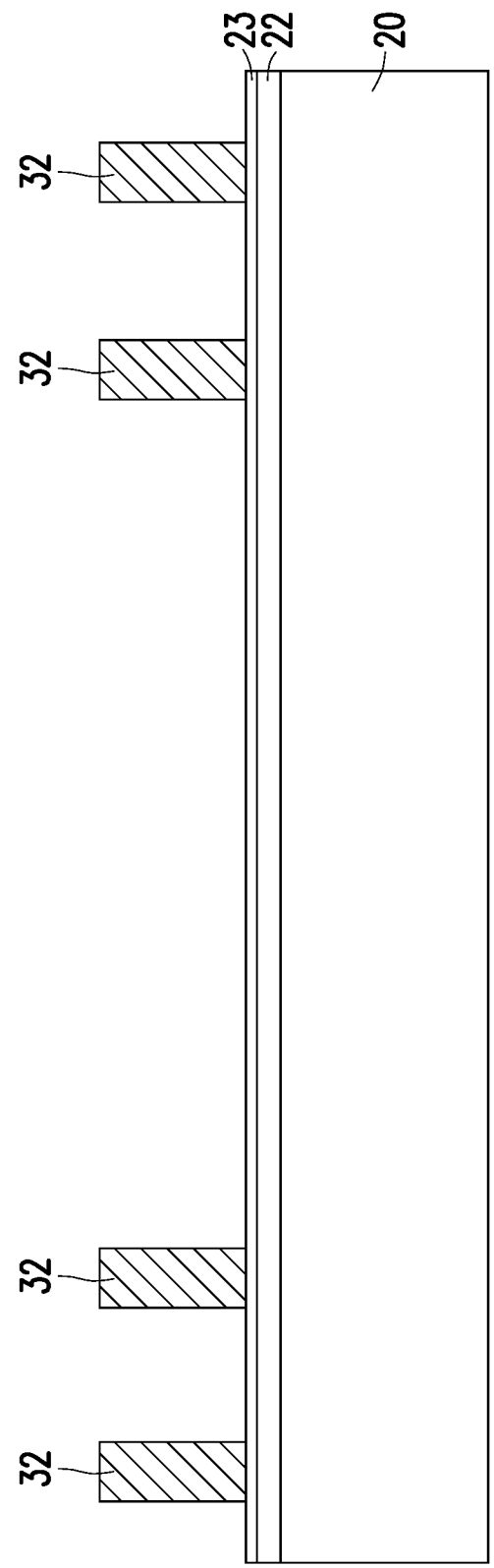

FIGS. 2 through 4 illustrate the formation of metal posts 32. The respective step is illustrated as step 404 in the process flow shown in FIG. 21. Throughout the description, metal posts 32 are alternatively referred to as through-vias 32 since metal posts 32 penetrate through the subsequently dispensed encapsulating material.

Referring to FIG. 2, metal seed layer 24 is formed, for example, through Physical Vapor Deposition (PVD). Metal seed layer 24 may be in physical contact with polymer buffer layer 23. In accordance with some embodiments of the present disclosure, metal seed layer 24 includes a titanium layer and a copper layer over the titanium layer. In accordance with alternative embodiments of the present disclosure, metal seed layer 24 includes a copper layer contacting LTHC coating 22.

As also shown in FIG. 2, photo resist 26 is formed over metal seed layer 24. A light-exposure is then performed on photo resist 26 using a photo lithography mask (not shown). After a subsequent development, openings 28 are formed in photo resist 26. Some portions of metal seed layer 24 are exposed through openings 28.

Next, as shown in FIG. 3, metal posts 32 are formed by plating a metallic material in openings 28. Metal posts 32 are alternatively referred to as through-vias or through-molding vias since they will penetrate through the subsequently formed encapsulating material (which may be a molding compound) in the final package. The plated metallic material may be copper or a copper alloy. The top surfaces of metal posts 32 are lower than the top surface of photo resist 26, so that the shapes of metal posts 32 are confined by openings 28. Metal posts 32 may have substantially vertical and straight edges. Alternatively, metal posts 32 may have a sand timer shape in a cross-sectional view, with the middle parts of metal posts 32 being narrower than the respective top parts and bottom parts.

In subsequent steps, photo resist 26 is removed, and hence the underlying portions of metal seed layer 24 are exposed. The exposed portions of metal seed layer 24 are then removed in an etching step, for example, in an anisotropic or an isotropic etching step. The edges of the remaining seed layer 24 are thus co-terminus with the respective overlying portions of metal posts 32. The resulting metal posts 32 are illustrated in FIG. 4. Throughout the description, the remaining portions of metal seed layer 24 are considered as parts of metal posts 32, and may not be illustrated separately. The top-view shapes of metal posts 32 include, and are not limited to, circular shapes, rectangles, hexagons, octagons, and the like. After the formation of metal posts 32, polymer buffer layer 23 is exposed.

Figure 5:
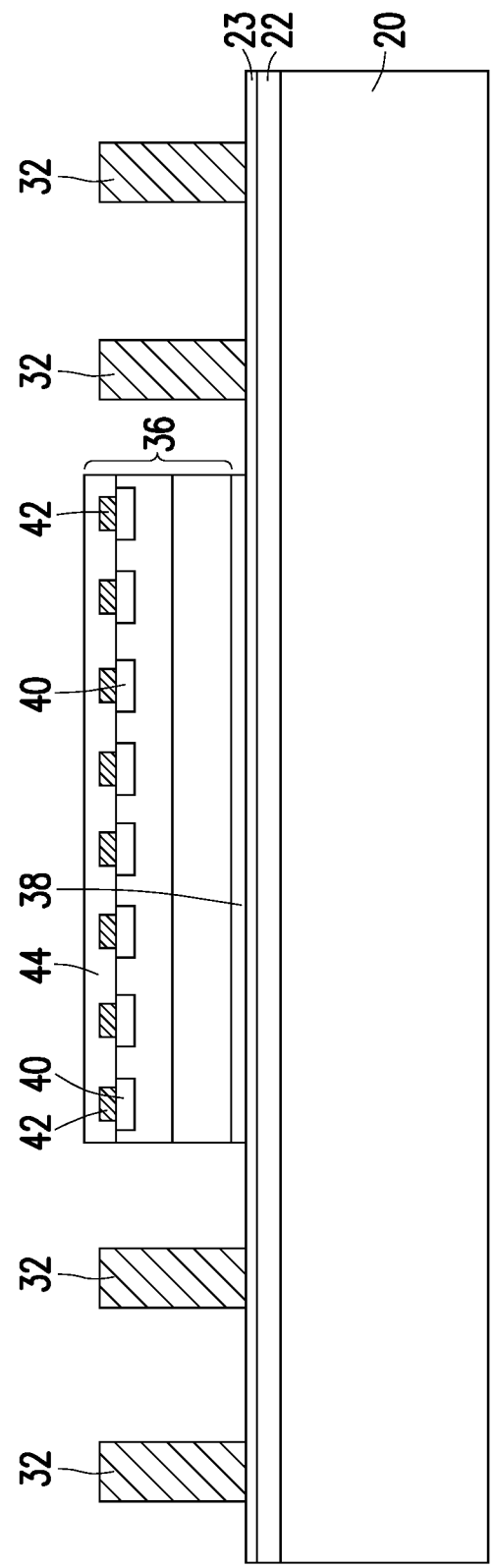

FIG. 5 illustrates the placement/attachment of device die 36. The respective step is illustrated as step 406 in the process flow shown in FIG. 21. Device die 36 is attached to polymer buffer layer 23 through Die-Attach Film (DAF) 38, which is an adhesive film pre-attached on device die 36 before device die 36 is placed on polymer buffer layer 23. Accordingly, DAF 38 and device die 36, before attached to polymer buffer layer 23, are in combination an integrated piece. Device die 36 may include a semiconductor substrate having a back surface (the surface facing down) in physical contact with DAF 38. Device die 36 may include integrated circuit devices (such as active devices, which include transistors, for example, not shown) at the front surface (the surface facing up) of the semiconductor substrate. In accordance with some embodiments of the present disclosure, device die 36 is a logic die, which may be a Central Processing Unit (CPU) die, a Graphic Processing Unit (GPU) die, a mobile application die, a Micro Control Unit (MCU) die, an input-output (IO) die, a BaseBand (BB) die, or an Application processor (AP) die. Since carrier 20 is at wafer level, although one device die 36 is illustrated, a plurality of identical device dies 36 is placed over polymer buffer layer 23, and may be allocated as an array including a plurality of rows and a plurality of columns.

In accordance with some exemplary embodiments, metal pillars 42 (such as copper pillars) are pre-formed as portions of device die 36, and metal pillars 42 are electrically coupled to the integrated circuit devices such as transistors (not shown) in device die 36. In accordance with some embodiments of the present disclosure, a dielectric material such as a polymer fills the gaps between neighboring metal pillars 42 to form top dielectric layer 44. Top dielectric layer 44 may also include a portion covering and protecting metal pillars 42. Polymer layer 44 may be formed of PBO or polyimide in accordance with some embodiments of the present disclosure.

Figure 6:
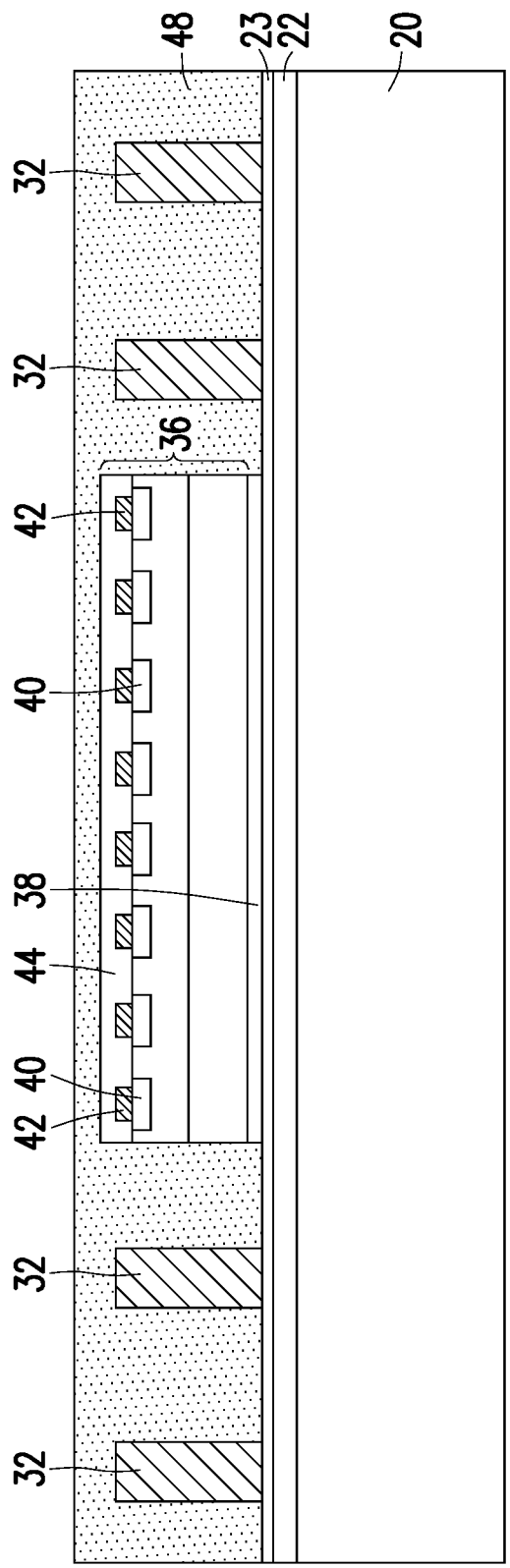

Next, device die 36 and metal posts 32 are encapsulated in encapsulating material 48, as shown in FIG. 6. The respective step is illustrated as step 408 in the process flow shown in FIG. 21. Encapsulating material 48 fills the gaps between neighboring through-vias 32 and the gaps between through-vias 32 and device die 36. Encapsulating material 48 may include a molding compound, a molding underfill, an epoxy, and/or a resin. The top surface of encapsulating material 48 is higher than the top ends of metal pillars 42. When formed of molding compound, encapsulating material 48 may include a base material, which may be a polymer, a resin, an epoxy, or the like, and filler particles (not shown, refer to FIG. 19C) in the base material. The filler particles may be dielectric particles of $SiO_2$, $Al_2O_3$, silica, or the like, and may have spherical shapes. Also, the spherical filler particles may have a plurality of different diameters. Both the filler particles and the base material in the molding compound may be in physical contact with polymer buffer layer 23, as also shown schematically in FIG. 19C.

Figure 7:
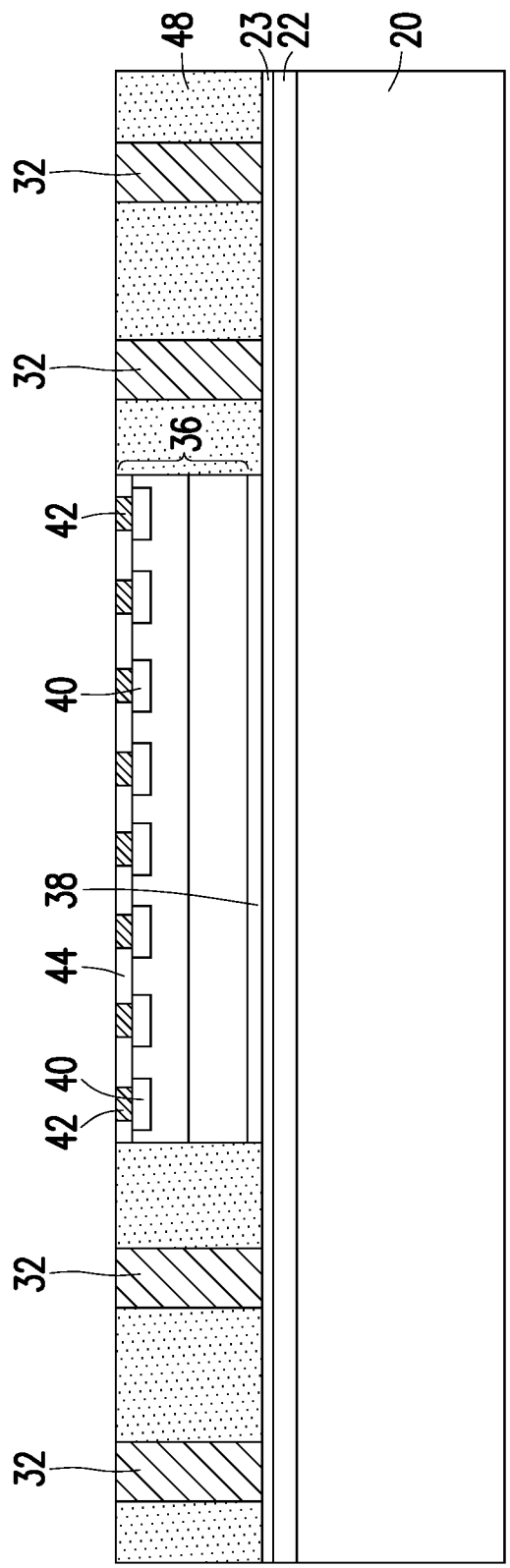

In a subsequent step, as shown in FIG. 7, a planarization step such as a Chemical Mechanical Polish (CMP) step or a mechanical grinding step is performed to thin encapsulating material 48 and dielectric layer 44, until through-vias 32 and metal pillars 42 are all exposed. The respective step is also illustrated as step 408 in the process flow shown in FIG. 21. Due to the planarization process, the top ends of through-vias 32 are substantially level (coplanar) with the top surfaces of metal pillars 42, and are substantially coplanar with the top surface of encapsulating material 48.

Figure 8:
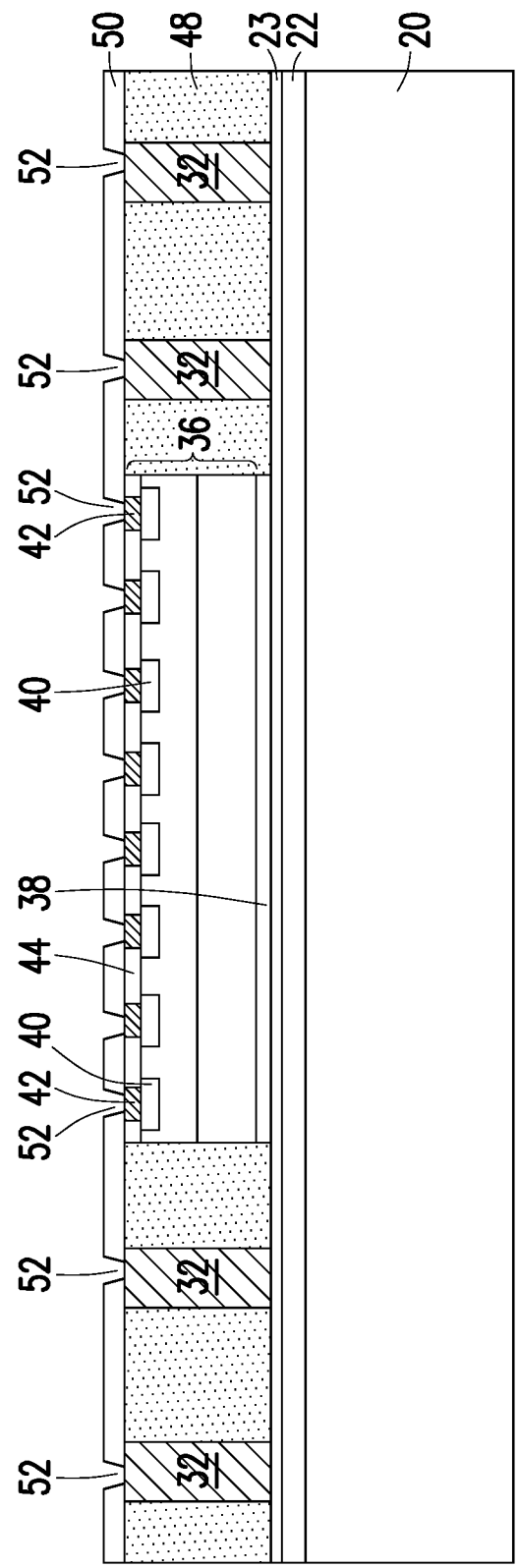
Figure 9:
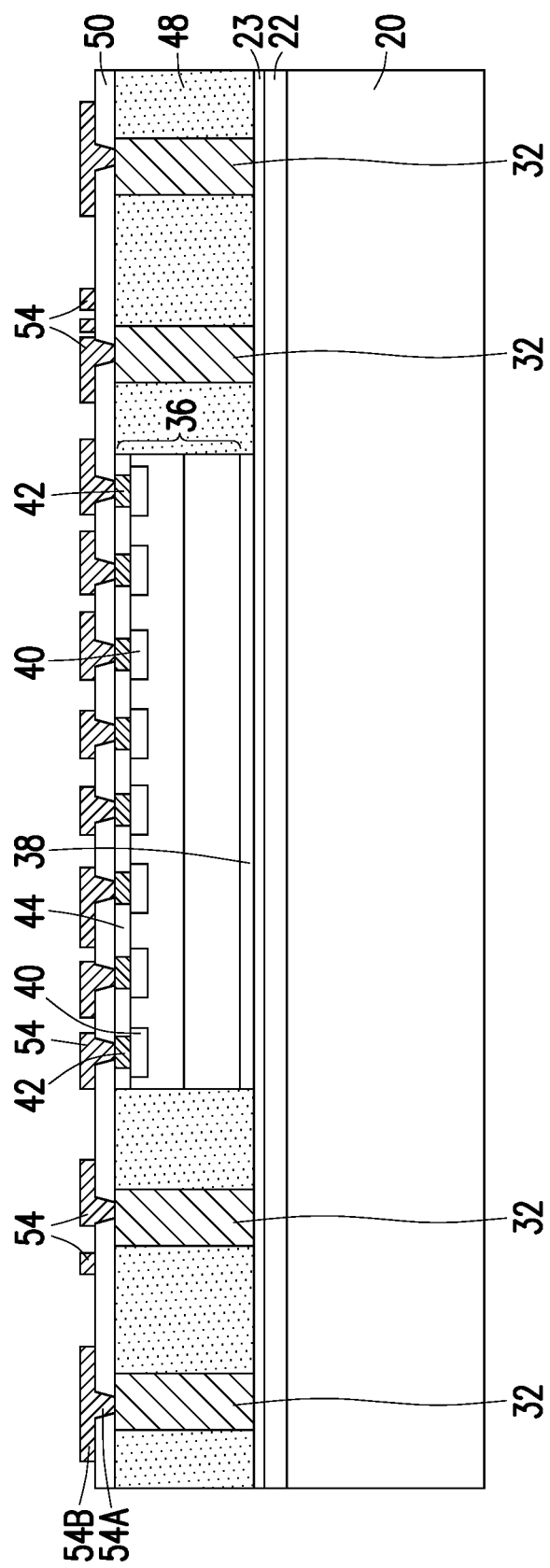

FIGS. 8 through 12 illustrate the formation of a front-side redistribution structure. FIGS. 8 and 9 illustrate the formation of a first layer of Redistribution Lines (RDLs) and the respective dielectric layer. Referring to FIG. 8, dielectric layer 50 is formed. The respective step is illustrated as step 410 in the process flow shown in FIG. 21. In accordance with some embodiments of the present disclosure, dielectric layer 50 is formed of a polymer such as PBO, polyimide, or the like. The formation method includes coating dielectric layer 50 in a flowable form, and then curing dielectric layer 50. In accordance with alternative embodiments of the present disclosure, dielectric layer 50 is formed of an inorganic dielectric material such as silicon nitride, silicon oxide, or the like. The formation method may include Chemical Vapor Deposition (CVD), Atomic Layer Deposition (ALD), Plasma-Enhanced Chemical Vapor Deposition (PECVD), or other applicable deposition methods. Openings 52 are then formed, for example, through a photo lithography process. In accordance with some embodiments in which dielectric layer 50 is formed of a photo sensitive material such as PBO or polyimide, the formation of openings 52 involves a photo exposure using a lithography mask (not shown), and a development step. Through-vias 32 and metal pillars 42 are exposed through openings 52.

Next, referring to FIG. 9, RDLs 54 are formed over dielectric layer 50. The respective step is illustrated as step 412 in the process flow shown in FIG. 21. RDLs 54 include vias 54A formed in dielectric layer 50 to connect to metal pillars 42 and through-vias 32, and metal traces (metal lines) 54B over dielectric layer 50. In accordance with some embodiments of the present disclosure, RDLs 54 (including 54A and 54B) are formed in a plating process, which includes depositing a metal seed layer (not shown), forming and patterning a photo resist (not shown) over the metal seed layer, and plating a metallic material such as copper and/or aluminum over the metal seed layer. The metal seed layer and the plated metallic material may be formed of the same material or different materials. The patterned photo resist is then removed, followed by etching the portions of the metal seed layer previously covered by the patterned photo resist. Although not shown, the top surfaces of the portions of RDLs 54 grown from openings 52 may be recessed lower than the portion of RDLs 54 directly overlying dielectric layer 50.

Figure 10:
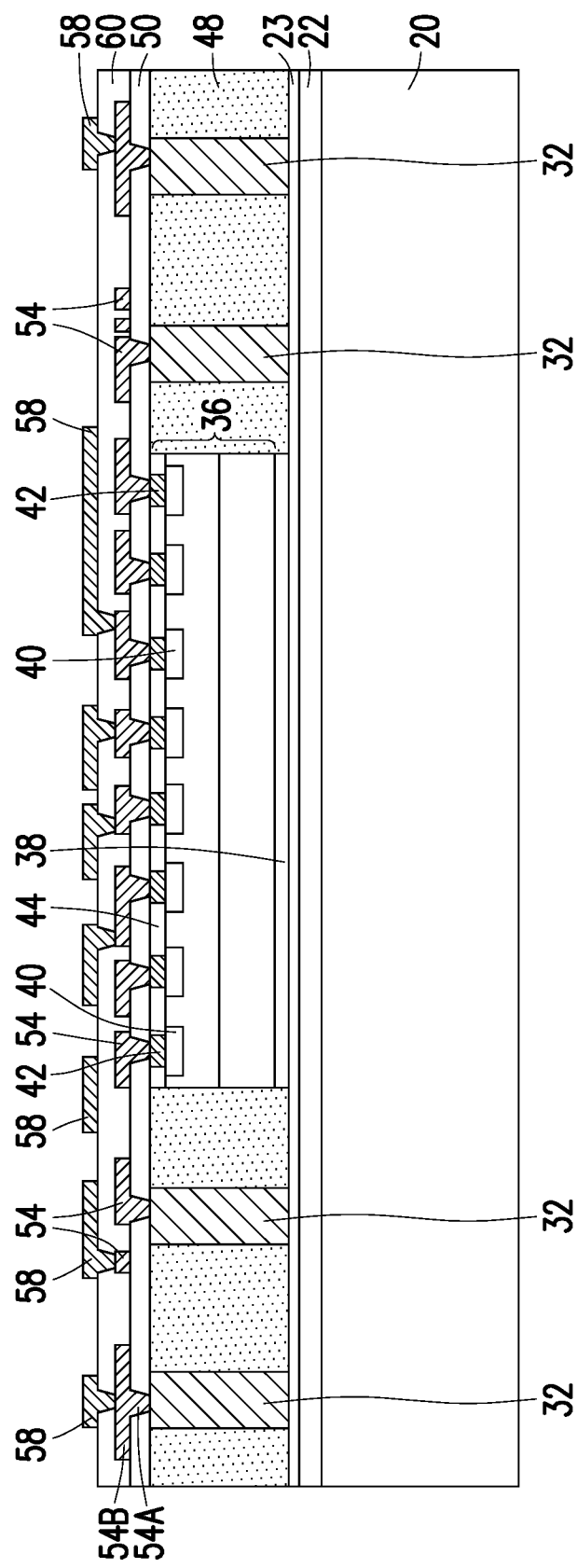

Referring to FIG. 10, in accordance with some embodiments of the present disclosure, dielectric layer 60 is formed over the structure shown in FIG. 9, followed by the formation of openings in dielectric layer 60. Some portions of RDLs 54 are thus exposed through the openings. Dielectric layer 60 may be formed using a material selected from the same candidate materials for forming dielectric layer 50, which may include PBO, polyimide, BCB, or other organic or inorganic materials. RDLs 58 are then formed. The respective step is illustrated as step 414 in the process flow shown in FIG. 21. RDLs 58 also include via portions extending into the openings in dielectric layer 60 to contact RDLs 54, and metal line portions directly over dielectric layer 60. The formation of RDLs 58 may be the same as the formation of RDLs 54, which includes forming a seed layer, forming a patterned mask, plating RDLs 58, and then removing the patterned mask and undesirable portions of the seed layer.

Figure 11:
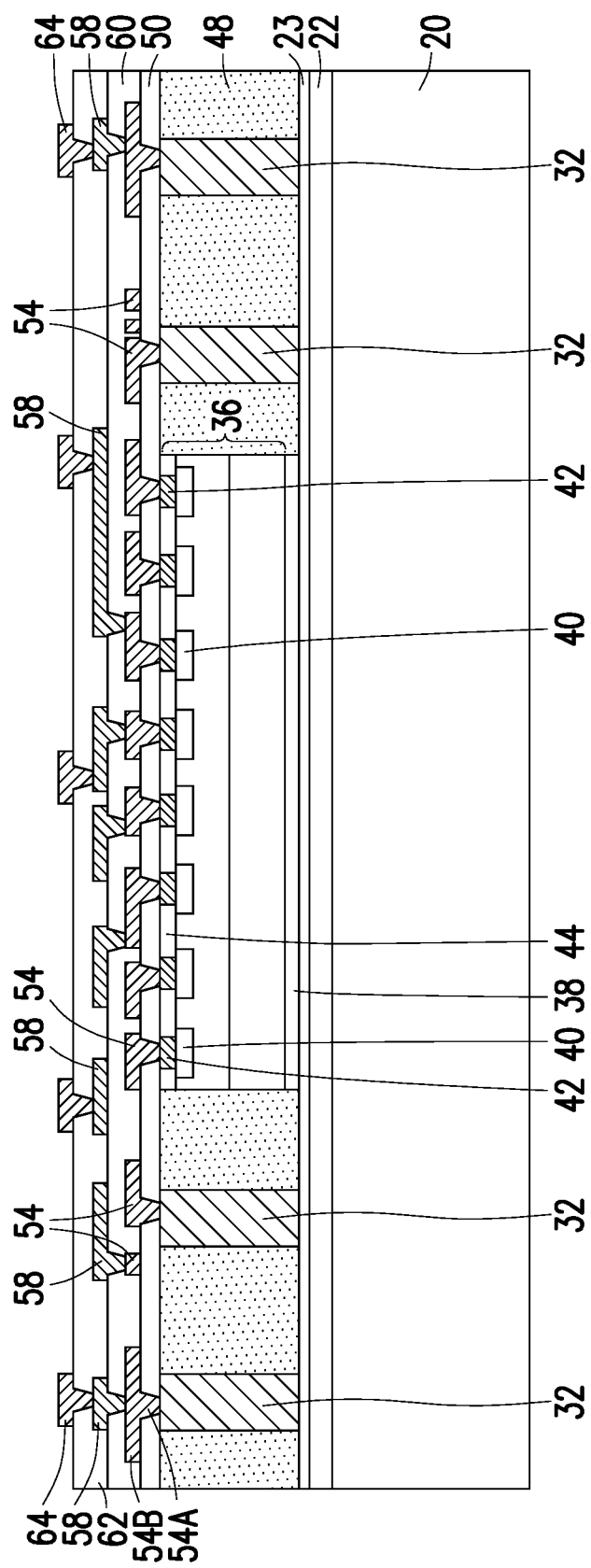

FIG. 11 illustrates the formation of dielectric layer 62 and RDLs 64 over dielectric layer 60 and RDLs 58. The respective step is illustrated as step 416 in the process flow shown in FIG. 21. Dielectric layer 62 may be formed of a material selected from the same group of candidate materials for forming dielectric layers 50 and 60. RDLs 64 may also be formed of a metal or a metal alloy including aluminum, copper, tungsten, or alloys thereof. It is appreciated that although in the illustrated exemplary embodiments, three layers of RDLs (54, 58 and 64) are formed, the package may have any number of RDL layers such as one layer, two layers, or more than three layers.

Figure 12:
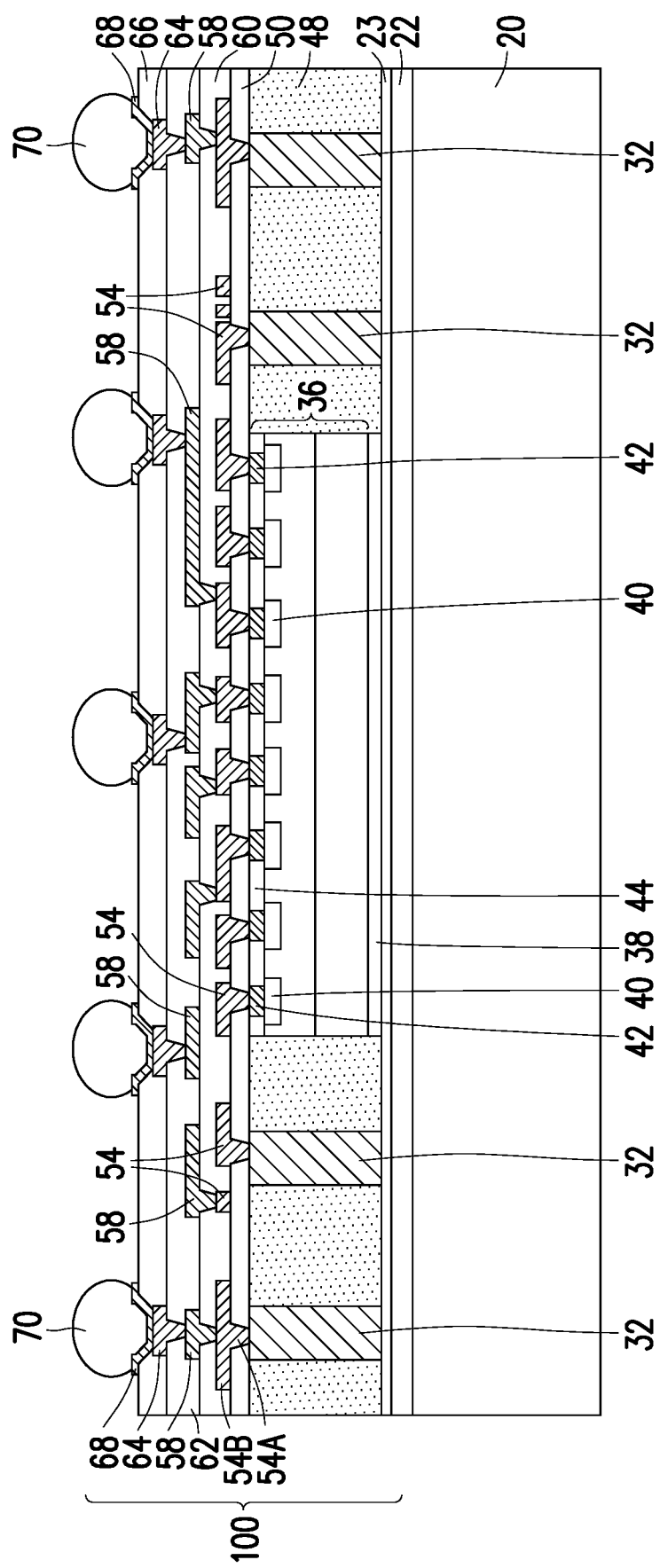

FIG. 12 illustrates the formation of dielectric layer 66, Under-Bump Metallurgies (UBMs) 68, and electrical connectors 70 in accordance with some exemplary embodiments. Dielectric layer 66 may be formed of a material selected from the same group of candidate materials for forming dielectric layers 50, 60, 62 and 66. For example, dielectric layer 66 may be formed using PBO, polyimide, or BCB. Openings are formed in dielectric layer 66 to expose the underlying metal pads, which are parts of RDLs 64 in the illustrative exemplary embodiments. In accordance with some embodiment of the present disclosure, UBMs 68 are formed to extend into the openings in dielectric layer 66 to contact the metal pads in RDLs 64. UBMs 68 may be formed of nickel, copper, titanium, or multi-layers thereof. In accordance with some exemplary embodiments, UBMs 68 include a titanium layer and a copper layer over the titanium layer.

Electrical connectors 70 are then formed. The respective step is illustrated as step 418 in the process flow shown in FIG. 21. The formation of electrical connectors 70 may include placing solder balls on the exposed portions of UBMs 68, and then reflowing the solder balls, and hence electrical connectors 70 are solder regions. In accordance with alternative embodiments of the present disclosure, the formation of electrical connectors 70 includes performing a plating step to form solder layers over UBMs 68, and then reflowing the solder layers. Electrical connectors 70 may also include non-solder metal pillars, or metal pillars and solder caps over the non-solder metal pillars, which may also be formed through plating. Throughout the description, the structure including release film 22 and the overlying structure in combination is referred to as package 100, which is a composite wafer (and also referred to as composite wafer 100 hereinafter) including a plurality of device dies 36.

Figure 13:
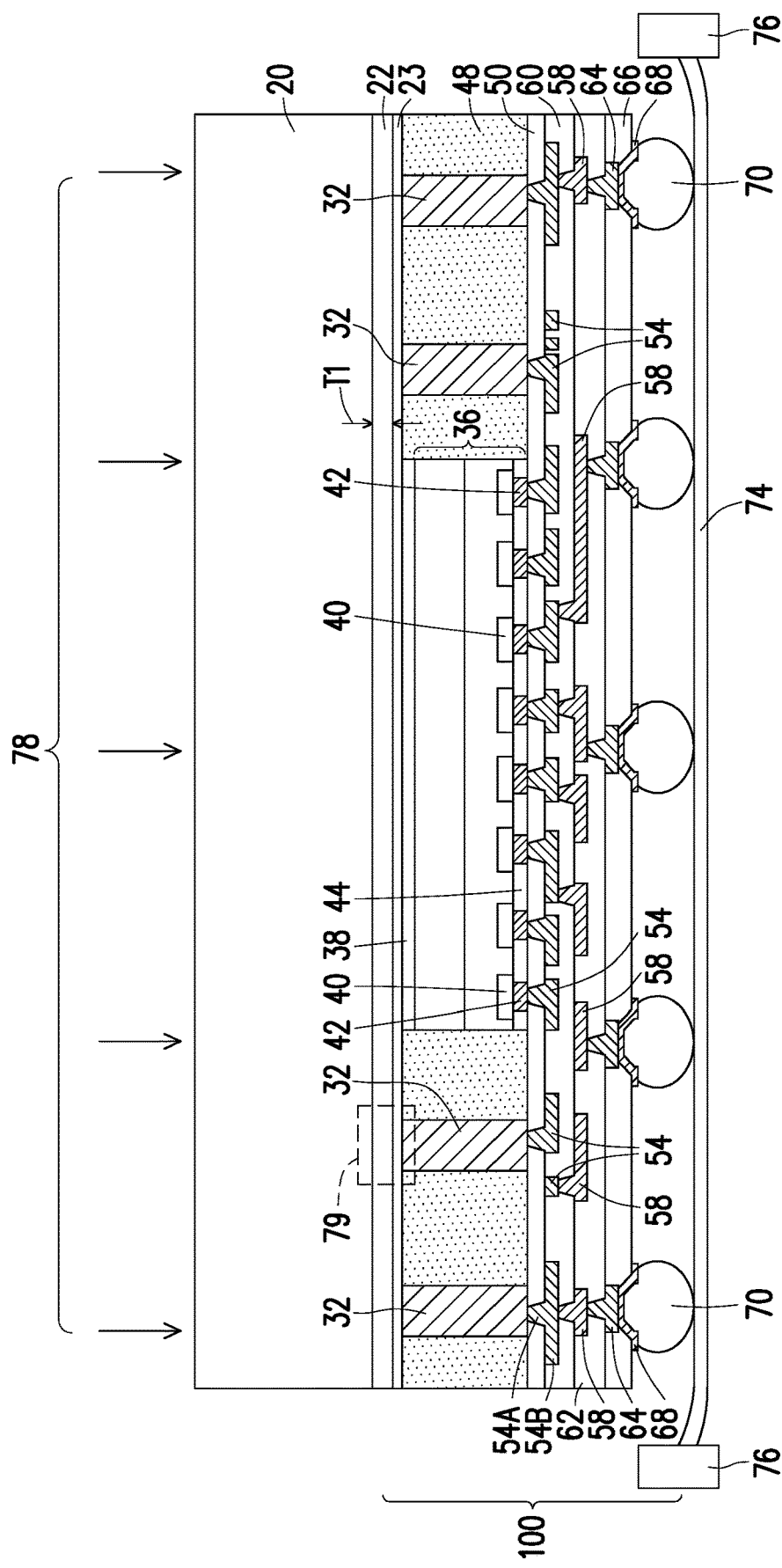

Next, referring to FIG. 13, composite wafer 100 is placed on tape 74, which is attached to frame 76. In accordance with some embodiments of the present disclosure, electrical connectors 70 are in contact with tape 74. Next, light 78 (or other type of heat-carrying radiation source) is projected on LTHC coating material 22, and light 78 penetrates through the transparent carrier 20. In accordance with some exemplary embodiments of the present disclosure, light 78 is a laser beam, which may be scanned back and forth on LTHC coating material 22, with each scanning being performed on an un-scanned portion of the LTHC coating material 22. In subsequent discussion, radiation 78 is referred to as laser beam 78 for simplicity, although it can be other types of radiation.

Figure 20B:
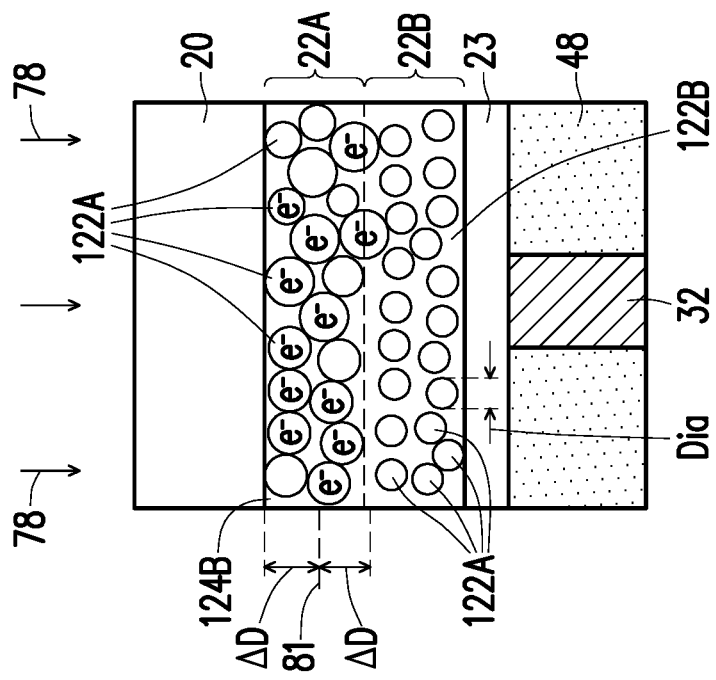
FIGS. 20A and 20B schematically illustrate a portion of the release film before and after a laser scanning.
Figure 20A:
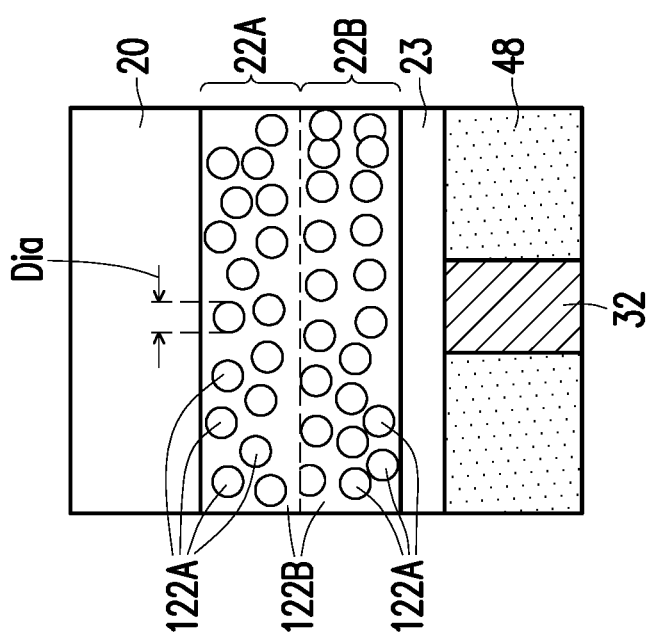

FIG. 20A shows the region 79 (shown in FIG. 13) before laser scanning is performed. In LTHC coating material 22, carbon black particles 122A are scattered in base material 122B, which may be acrylic in accordance with some embodiments. Carbon black particles 122A do not form a continuous conductive path since carbon black particles 122A are isolated from each other by base material 122B.

FIG. 20B illustrates a magnified view of region 79 (FIG. 13) during and after the laser scanning is performed. LTHC coating material 22 includes portion 22A, which is in the working range of laser beam 78. Portion 22B of LTHC coating material 22 is outside of the working range of laser beam 78. The working range of laser beam 78 is the range in which the energy of laser beam 78 is adequate for decomposing LTHC coating material 22. Outside of the working range, either laser beam 78 has been absorbed or blocked in the working range already, or the energy of laser beam 78 is not adequate for decomposing LTHC coating material 22, even though laser beam 78 may reach beyond the working range. Accordingly, during the laser beam scan, (the base material 122B in) portion 22A of LTHC coating material 22 is decomposed in response to the heat introduced by the light exposure, and portion 22B is not decomposed.

In accordance with some embodiments of the present disclosure, the laser beam 78 is focused to the level 81 as shown in FIG. 20B. Level 81 is beneath the interface between carrier 20 and LTHC coating material 22. The working range of laser 78 includes both the range over focus level 81 by depth ΔD and the range lower than focus level 81 by depth ΔD. Depth ΔD may be about 0.5 μm in accordance with some embodiments. It is appreciated that the working range is affected by various factors including, and not limited to, the energy level of the laser beam, the scanning speed, the absorption rate of the energy by LTHC coating material 22, etc.. In accordance with some embodiments of the present disclosure, the focus level 81 is adjusted to allow the top of working range to reach the interface between LTHC coating material 22 and carrier 20, and the bottom of the working range to be higher than the bottom surface of LTHC coating material 22.

During the laser scanning, charges (such as electrons as indicated by the e-symbols) are induced, and are trapped in carbon black particles 122A. Furthermore, the laser scanning causes the swelling of carbon black particles 122A, and hence the isolated carbon black particles 122A are interconnected, creating a continuous conductive path.

Figure 14:
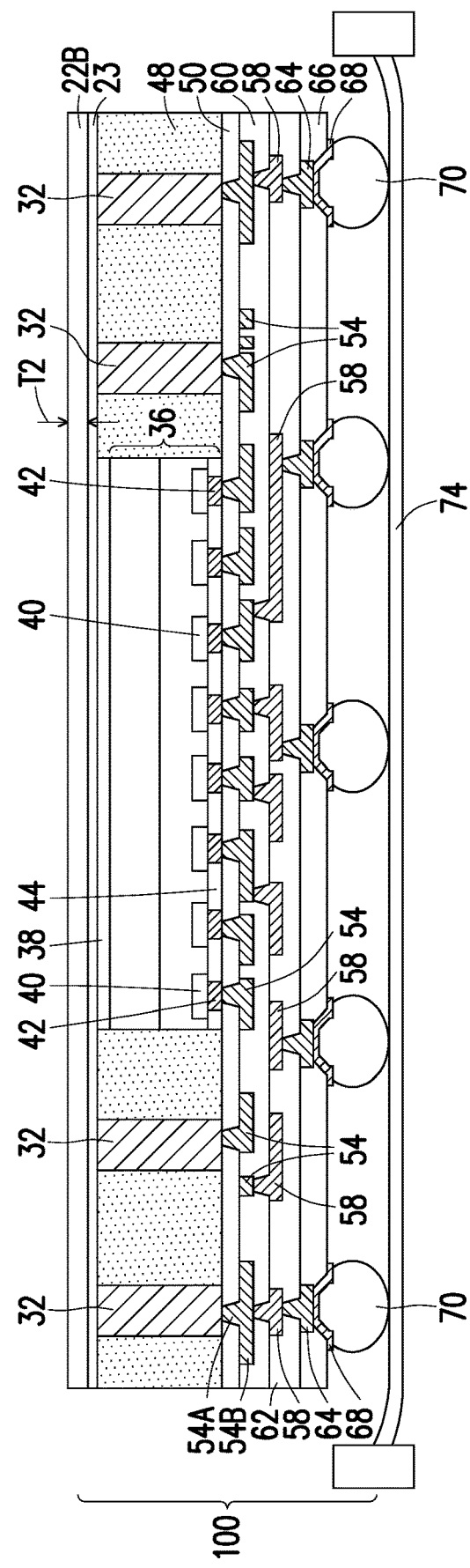

As a result of the light-exposure (such as the laser scanning), carrier 20 may be lifted off from LTHC coating material 22, and hence composite wafer 100 is de-bonded (demounted) from carrier 20. The respective step is illustrated as step 420 in the process flow shown in FIG. 21. The resulting composite wafer 100 is shown in FIG. 14. During the light exposure, portion 22A (FIG. 20B) of LTHC coating material 22 is decomposed. Portion 22B of LTHC coating material 22 is not decomposed, and hence remains after carrier 20 has been lifted off. In accordance with some embodiments of the present disclosure, the total thickness T1 (FIG. 13) of LTHC coating material 22 before decomposition is in the range between about 1.5 μm and about 2.5 μm. The thickness T2 (FIG. 14) of the remaining portion 22B of LTHC coating material 22 may be in the range between about 0.5 μm and about 1.5 μm in accordance with some exemplary embodiments. Furthermore, the ratio of the thickness T2 of the undecomposed portion to the total thickness T1 of LTHC coating material 22 may be in the range between about 0.4 and about 0.7. Furthermore, thickness T2 of the undecomposed portion may be greater than 5 times the diameter Dia (FIGS. 20A and 20B) of carbon black particles 122A to ensure that portion 22B has enough thickness to act as an effective dielectric barrier.

During the lift-off of carrier 20, a large amount of static charges may be generated due to the friction on carrier 20. The static charges may be compounded with the charges generated in the laser scan, and are conducted through the conductive path formed of the swollen carbon black particles 122A. If portion 22B of LTHC coating material 22 does not exist, portions 22A (hence the continuous conduction path) will extend to polymer buffer layer 23. The large amount of charges may penetrate through polymer buffer layer 23, and are conducted to through-vias 32. Through through-vias 32 and RDLs 54, 58, etc., the charges may be conducted into device die 36, and damage the devices and the thin metal lines in device die 36. This is referred to electrical overstress (EOS).

In accordance with some embodiments of the present disclosure, portions 22B, partially due to that carbon black particles 122A therein do not form continuous paths, act as a dielectric barrier. The dielectric barrier prevents the charges from reaching through-vias 32. Accordingly, the possibility of the EOS damage is reduced. Experiment results obtained from sample wafers revealed that by adopting the embodiments of the present disclosure, a majority of the EOS damage is eliminated, and the EOS damage may be reduced by 98 percent.

In accordance with some embodiments of the present disclosure, the remaining un-decomposed portion 22B (FIG. 14) of LTHC coating material 22 may be a blanket layer without any opening for exposing the underlying polymer buffer layer 23.

In accordance with some embodiments of the present disclosure, after the lift-off of carrier 20, the remaining LTHC coating material 22 is removed, hence exposing the underlying polymer buffer layer 23. The respective step is illustrated as step 422 in the process flow shown in FIG. 21. The removal of LTHC coating material 22 may be through a plasma cleaning step, for example, using the plasma of nitrogen ($N_2$), oxygen ($O_2$), $CF_4$, and the like. The resulting composite wafer 100 is shown in FIG. 14.

Figure 15:
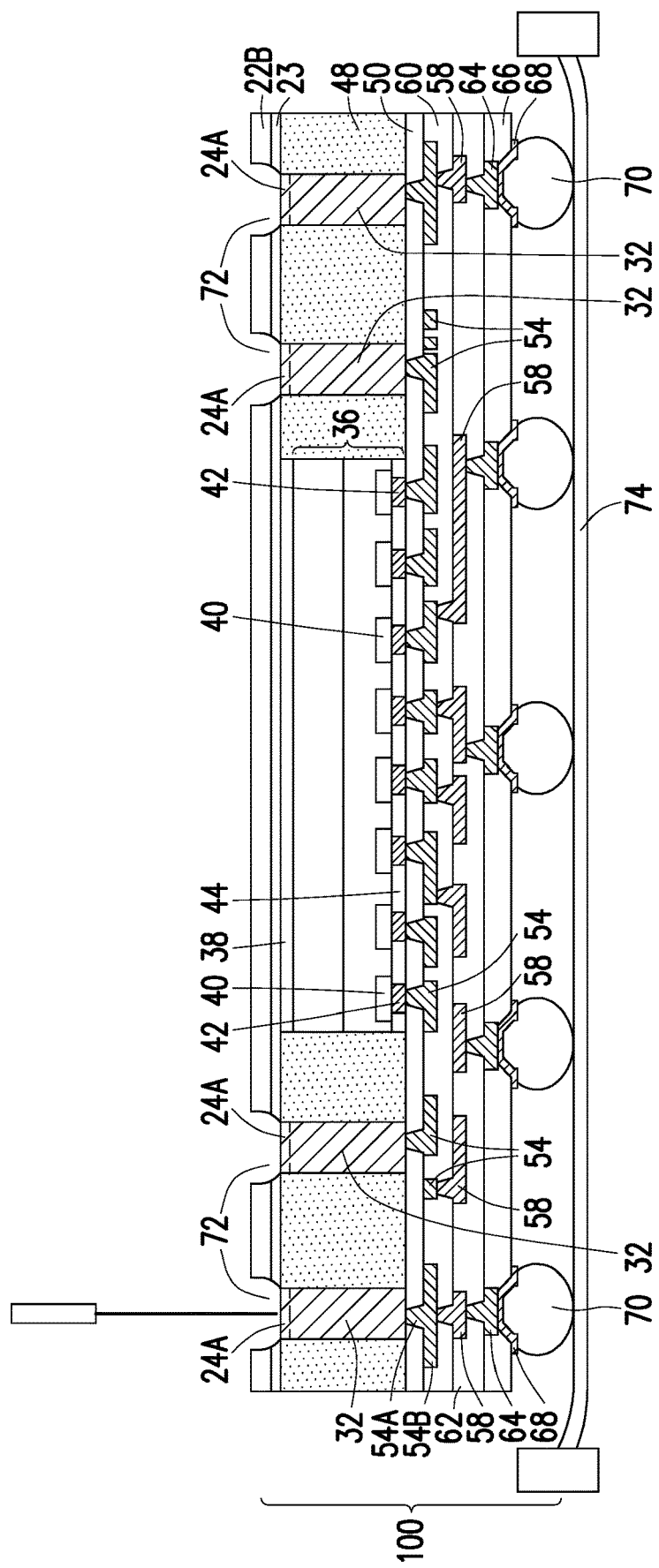
Figure 21:
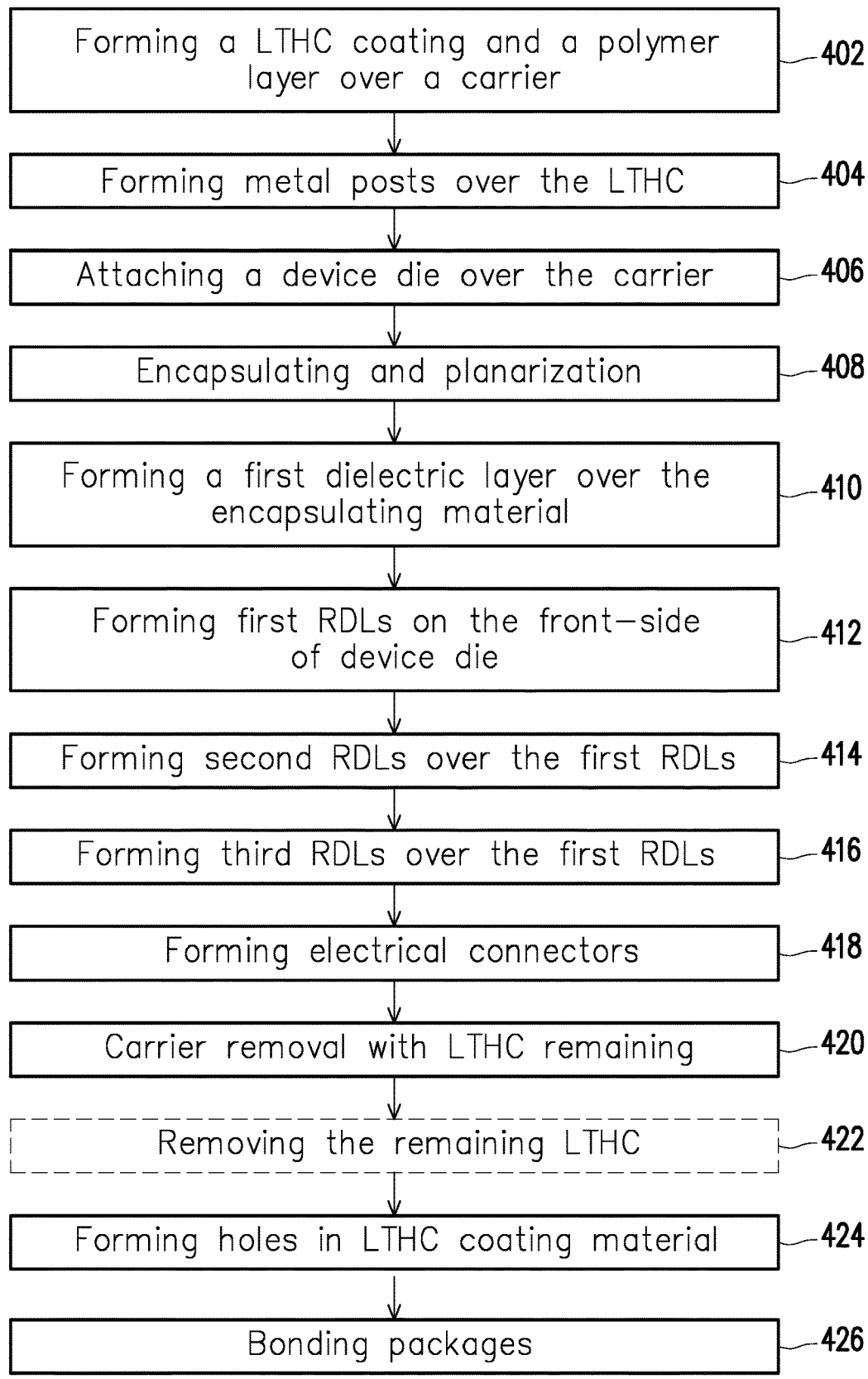
FIG. 21 illustrates a process flow for forming a package in accordance with some embodiments.

In accordance with alternative embodiments of the present disclosure, the remaining LTHC coating material 22 is not removed. Step 422 in FIG. 21 is thus illustrated as being dashed to indicate this step may or may not be performed. The top surface of LTHC coating material 22 may have a co-planarity meeting specification of the manufacturing process of the package. Accordingly, no planarization of the top surface of LTHC coating material 22 will be performed. If, however, after the lift-off of carrier 20, LTHC coating material 22 has a roughness greater than the maximum-acceptable roughness specified by the specification, and the high roughness may cause the lost in yield, a planarization such as Chemical Mechanical Polish (CMP) or mechanical grinding may be performed to level the top surface of LTHC coating material 22. The planarization removes a top surface portion of LTHC coating material 22, while leaving a blanket bottom portion unremoved. Referring to FIG. 15, openings 72 are formed in LTHC coating material 22 and polymer buffer layer 23, and hence through-vias 32 are exposed. The respective step is illustrated as step 424 in the process flow shown in FIG. 21. In accordance with some embodiments of the present disclosure, openings 72 are formed through laser drill, during which some portions of LTHC coating material 22 directly over through-vias 32 are burned and decomposed by laser. In accordance with alternative embodiments of the present disclosure, openings 72 are formed through etching in a lithography process.

In accordance with some embodiments of the present disclosure, titanium layers 24A are exposed after the laser drill. The titanium layers 24A are the remaining portions of metal seed layer 24 as shown in FIG. 3. In a subsequent step, an etching step is performed to remove the titanium layers. Since titanium has a higher electrical resistivity than copper, by removing the titanium layers, the copper portions of through-vias 32, which have a lower resistivity than titanium layers, are exposed. Hence, the electrical connection to through-vias 32 may be established with a lower resistance. In accordance with some embodiments of the present disclosure, the etching of titanium layers is performed through wet etching using a hydrogen fluoride (HF) solution, a phosphoric acid, or a mixture of HF and phosphoric acid. The etching may also be performed using dry etching.

In the etching of titanium layers 24A, LTHC coating material 22 is not etched. Accordingly, the material of LTHC coating material 22 and the etchant of titanium layers 24A are selected, so that the etchant, while is capable of etching titanium layers 24A, does not attack LTHC coating material 22.

Figure 16:
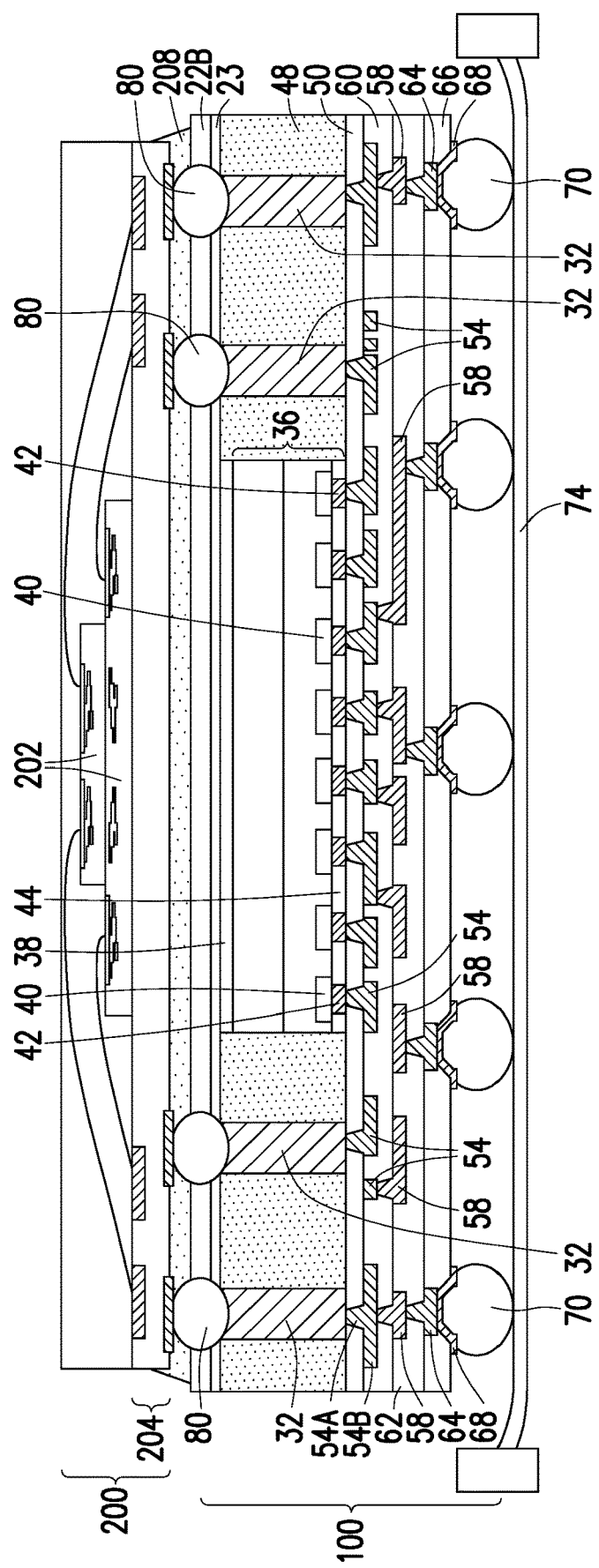
Figure 17:
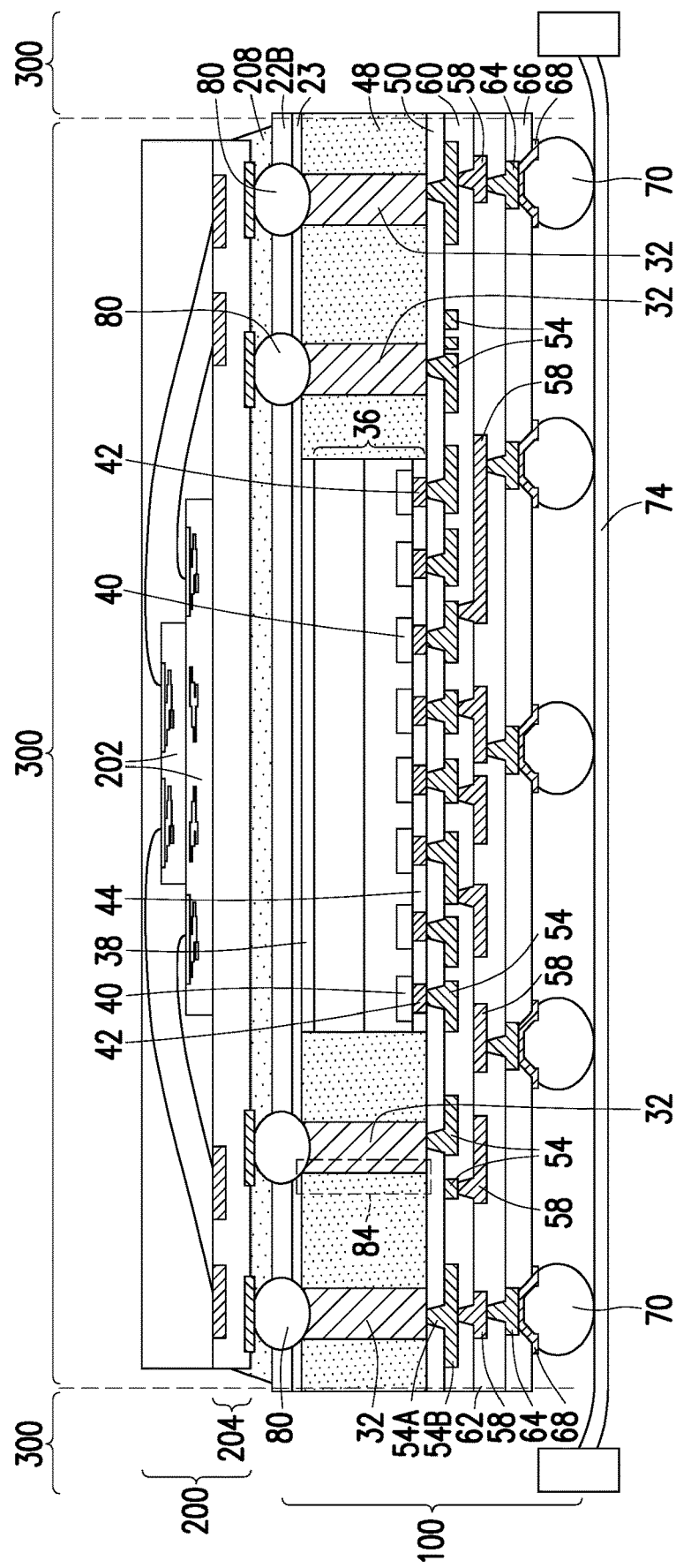

Composite wafer 100 includes a plurality of packages 100' (refer to FIG. 17), which are identical to each other, with each of packages 100' including a plurality of through-vias 32 and one device die 36. LTHC coating material 22 spans across the entire wafer-level package 100. FIG. 16 illustrates the bonding of a plurality of packages 200 (with one package 200 illustrated) onto composite wafer 100, thus forming a plurality of identical Package-on-Package (PoP) structure/packages 300 (FIG. 17). The bonding is performed through solder regions 80, which join through-vias 32 to metal pads 206 in the overlying package 200. In accordance with some embodiments of the present disclosure, package 200 includes package substrate 204 and device die(s) 202, which may be memory dies such as Static Random Access Memory (SRAM) dies, Dynamic Random Access Memory (DRAM) dies, or the like. Underfill 208 is also disposed into the gap between packages 200 and the underlying composite wafer 100, and is cured. Underfill 208 may be in contact with LTHC coating material 22.

In accordance with alternative embodiments of the present disclosure, instead of bonding package 200 to composite wafer 100 directly through openings 72 (FIG. 15), backside RDLs (not shown) are formed, and package 200 is bonded over the backside RDLs in the backside redistribution structure. The backside RDLs thus will include vias (not shown) extending into LTHC coating material 22, and metal lines (not shown) over LTHC coating material 22. The backside RDLs are such named since these RDLs, if formed, will be on the backside of device die 36. In order to form the backside RDLs, a carrier, instead of a tape, may be placed under composite wafer 100 as a support in the formation of the backside RDLs. Accordingly, electrical connectors 70 are adhered to the carrier through an adhesive film (not shown) during the formation of the backside RDLs.

Next, referring to FIG. 17, a singulation (die-saw) process is performed to separate composite wafer 100 into individual packages 300, which are identical to each other. The singulation may be performed when composite wafer 100 is located on tape 74. The singulation may be performed using a blade, or may be performed using a laser beam to do pre-grooving, so that grooves are formed, and then using a blade to cut through the grooves.

Figure 18A:
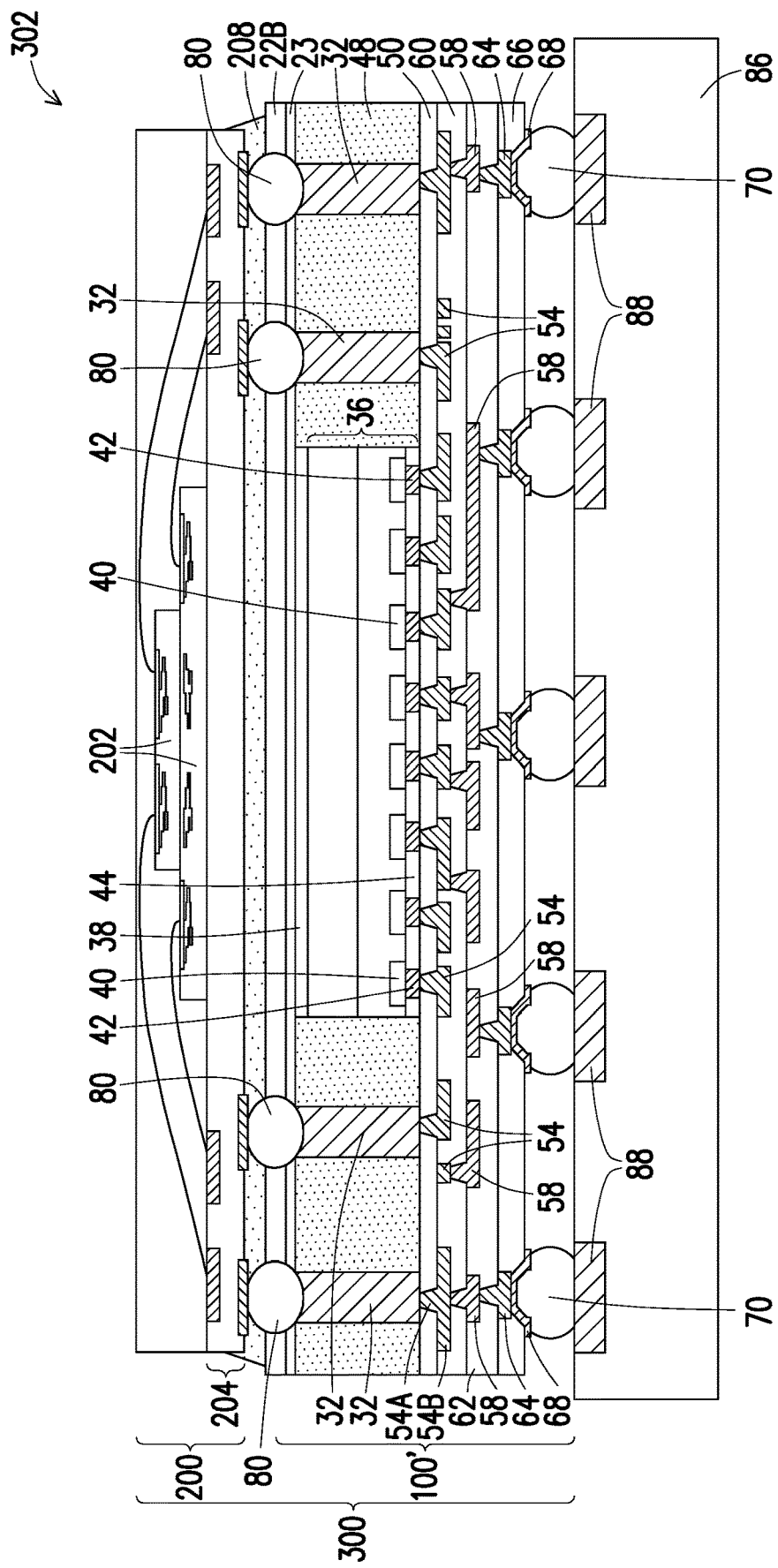

FIG. 18A illustrates the bonding of the singulated package 300 to package component 86 through solder regions 70, thus forming package 302. The respective step is illustrated as step 426 in the process flow shown in FIG. 21. In accordance with some embodiments of the present disclosure, package component 86 is a package substrate, which may be a coreless substrate or a substrate having a core. In accordance with other embodiments of the present disclosure, package component 86 is a printed circuit board or a package. Solder regions 70 may be bonded to bond pads 88 in package component 86.

Figure 18B:
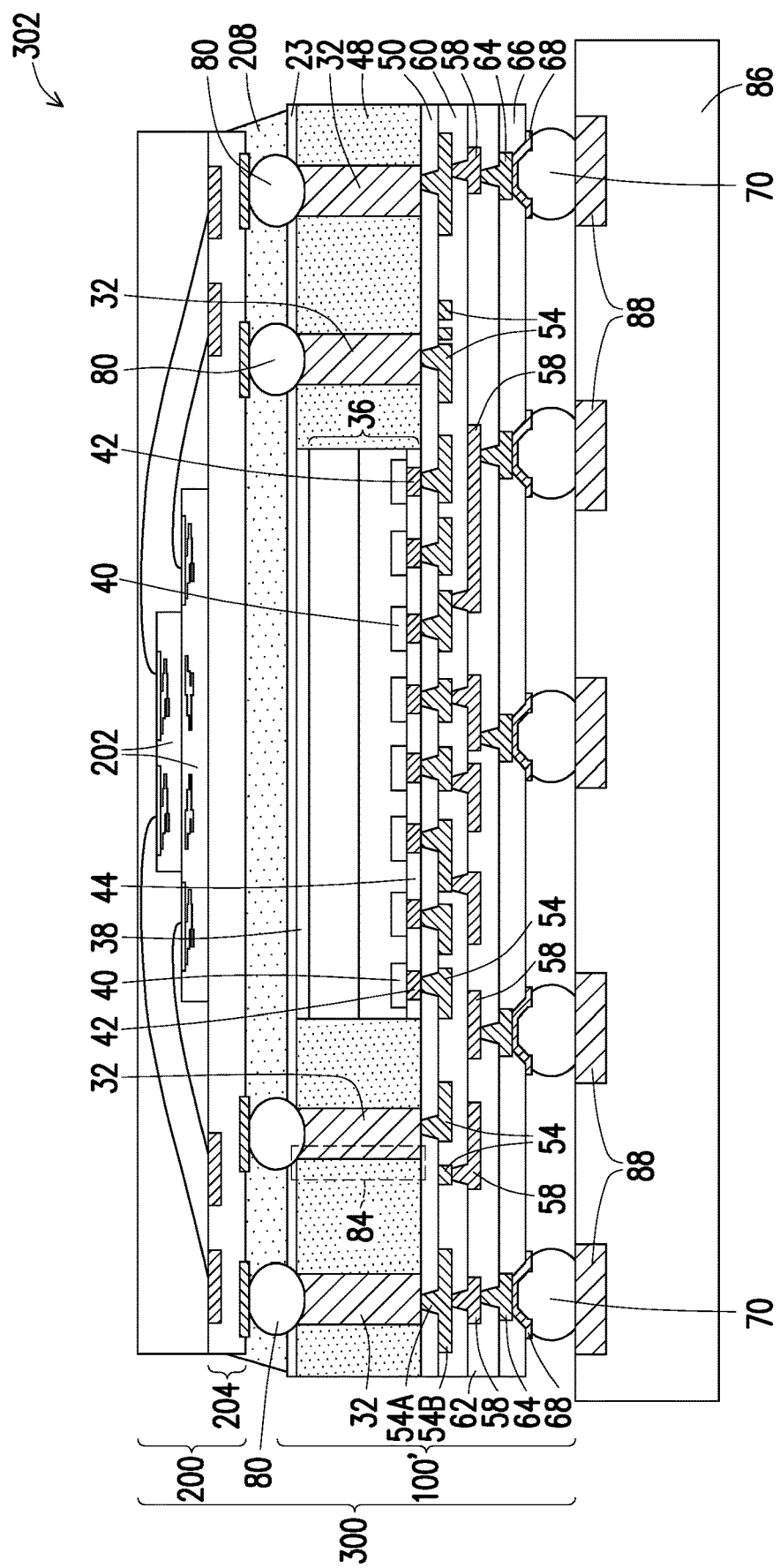
FIG. 18B illustrates the cross-sectional view of a package in accordance with some embodiments.

FIG. 18B illustrates package 302 formed in accordance with alternative embodiments of the present disclosure. These embodiments are similar to the embodiments shown in FIG. 18A, except that after the lift-off of carrier 20, the remaining LTHC coating material 22 (FIG. 14) is removed. Accordingly, as shown in FIG. 18B, underfill 208 is in contact with polymer buffer layer 23.

Figure 19A:
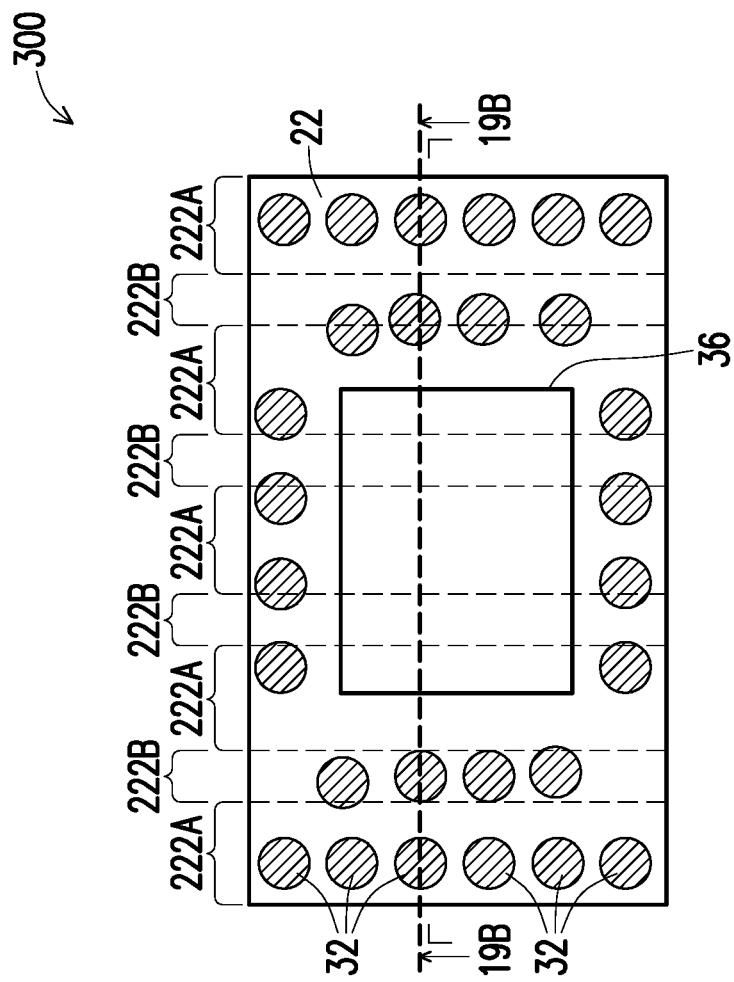
FIGS. 19A and 19B illustrate a top view and a cross-sectional view, respectively, of a portion of a release film in a package in accordance with some embodiments.

FIG. 19A illustrates a top view of some portions of an exemplary package 300, wherein through-vias 32, LTHC coating material 22, and device die 36 are illustrated, while other features are not shown for simplicity. In accordance with some embodiments of the present disclosure, the decomposition of LTHC coating material 22 is performed through laser, which is in the form of a laser beam. The laser beam is narrower than package 300, and it takes a plurality of laser beam scanning paths to cover the entire package 300 (and to cover composite wafer 100 as shown in FIG. 13). The paths of the plurality of laser beam scan may slightly overlap with each other to ensure the full coverage of LTHC coating material 22 without leaving some portions undesirably not scanned. The overlapped portions receive double scanning compared to the non-overlapped portions. In accordance with some embodiments of the present disclosure, the thickness of the decomposed LTHC coating material 22 in the double-scanned regions is greater than the thickness of the decomposed LTHC coating material 22 in the single-scanned regions. This results in the top surface of LTHC coating material 22 to have some portions recessed more than other portions. For example, FIG. 19A schematically illustrates portions 222A and portions 222B recessed more than portions 222A. Portions 222B and 222A have an alternating layout, with portions 222A being single-scanned portions, and portions 222B being double-scanned portions. Furthermore, portions 222A and 222B may be substantially straight in the top view.

Figure 19C:
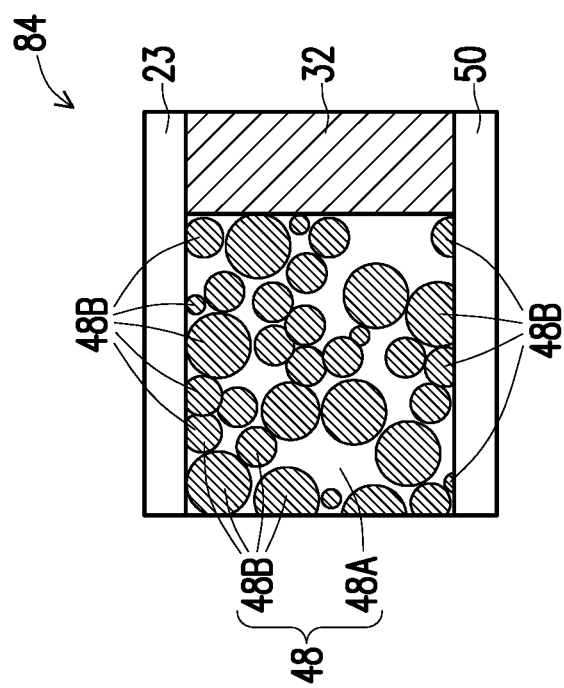
FIG. 19C illustrates the amplified view of a portion of a release film in accordance with some embodiments.
Figure 19B:
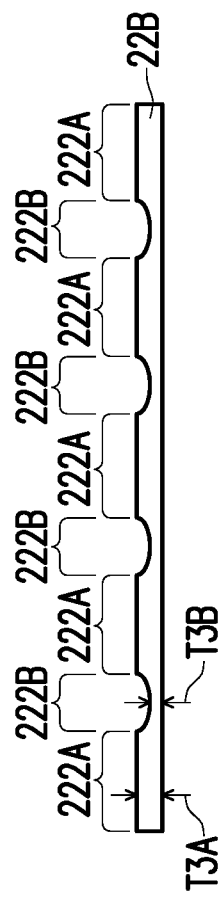

FIG. 19B illustrates a cross-sectional view of LTHC coating material 22 in accordance with some exemplary embodiments of the present disclosure. Portions 222A and 222B are also illustrated. The thicknesses T3A of portions 222A and T3B of portions 222B are also illustrated. Thickness T3A is greater than thickness T3B. In accordance with some embodiments of the present disclosure, the difference (T3A-T3B) is greater than about 0.1 μm, and may be in the range between about 0.1 μm and about 0.5 μm. Accordingly, in package 300, LTHC coating material 22 has portions with alternating thicknesses. Portions 222A may have a substantially uniform width, and portions 222B may have a substantially uniform width, and the width of portions 222A may be greater than the width of portions 222B.

Portions 222B (and also possibly portions 222A) may have dishing shapes in the cross-sectional view, with the middle part of a portion 222B (or a portion 222A) being recessed more than edge portions of the portion 222B/222A. Furthermore, the dishing shapes may be curved.

FIG. 19C illustrates an amplified view of region 84 in FIG. 17. As shown in FIG. 19C, encapsulating material 48 includes base material 48A and filler particles 48B in base material 48A. Since encapsulating material 48 is encapsulated on polymer buffer layer 23 (as shown in FIG. 6), and no planarization is performed on the portion of encapsulating material 48 that contacts polymer buffer layer 23, the spherical particles 48B that are in contact with polymer buffer layer 23 are rounded, with the rounded surfaces in contact with polymer buffer layer 23. Furthermore, no spherical particles 48B at this interface are ground to have planar surfaces coplanar with the illustrated top surface of base material 48. As a comparison, the portions of encapsulating material 48 in contact with dielectric layer 50 have been planarized in the step shown in FIG. 7. Accordingly. The spherical particles 48B in contact with dielectric layer 50 are partially cut during the planarization, and hence will have substantially planar bottom surfaces (rather than rounded bottom surfaces) in contact with dielectric layer 50.

In the above-illustrated exemplary embodiments, some exemplary processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By making the LTHC coating material to have a thickness greater than the working range of the laser used for decomposing the LTHC coating material, a remaining portion of the LTHC coating material not decomposed is used as a dielectric barrier layer to prevent charges from being discharged into the device dies in the InFO package, and the EOS damage is avoided.

In accordance with some embodiments of the present disclosure, a method includes forming a release film over a carrier, forming a polymer buffer layer over the release film, forming a metal post on the polymer buffer layer, encapsulating the metal post in an encapsulating material, performing a planarization on the encapsulating material to expose the metal post, forming a redistribution structure over the encapsulating material and the metal post, and decomposing a first portion of the release film. A second portion of the release film remains after the decomposing. An opening is formed in the polymer buffer layer to expose the metal post. In an embodiment, the method includes bonding a package component to the metal post; and dispensing an underfill between the package component and the second portion of the release film. In an embodiment, the decomposing the first portion of the release film is performed by projecting a laser beam on the release film. In an embodiment, the release film comprises a polymer base material and carbon black particles. In an embodiment, the method includes removing the second portion of the release film before the opening is formed in the polymer buffer layer. In an embodiment, the opening extends into both the polymer buffer layer and the second portion of the release film. In an embodiment, the first portion of the release film has a first thickness before the decomposing, and the release film has a second thickness before the decomposing, and a ratio of the first thickness to the second thickness is in a range between about 0.4 and 0.7.

In accordance with some embodiments of the present disclosure, a method includes coating an LTHC coating material on a carrier; forming a polymer buffer layer over the LTHC coating material; forming a metal seed layer in contact with the polymer buffer layer; forming a patterned photo resist over the metal seed layer, with a portion of the metal seed layer being exposed through an opening in the patterned photo resist; plating a metal post over the metal seed layer; removing the patterned photo resist; etching the metal seed layer to expose the polymer buffer layer; projecting a laser beam on the LTHC coating material, wherein a working range of the laser beam covers a first portion of the LTHC coating material, and a second portion of the LTHC coating material is out of the working range; lifting off the carrier; and forming a solder region penetrating through the second portion of the LTHC coating material. In an embodiment, after the carrier is lifted off, the second portion of the LTHC coating material remains as being a blanket layer, and the blanket layer is free from any opening to expose the polymer buffer layer. In an embodiment, the method includes forming an opening in the second portion of the LTHC coating material and the polymer buffer layer, wherein the solder region extends into the opening. In an embodiment, the method includes removing the second portion of the LTHC coating material. In an embodiment, the projecting the laser beam comprises scanning the laser beam through an entirety of the LTHC coating material. In an embodiment, the method includes, after the carrier is lifted off, performing a planarization on the second portion of the LTHC coating. In an embodiment, the method includes, after the carrier is lifted off and before the solder region is formed, etching a portion of a remaining portion of the metal seed layer.

In accordance with some embodiments of the present disclosure, a package includes an encapsulating material; a through-via penetrating through the encapsulating material; a polymer buffer layer contacting the through-via and the encapsulating material; an LTHC coating material contacting the polymer buffer layer; and a solder region penetrating through the LTHC coating material and the polymer buffer layer. In an embodiment, the LTHC coating material is configured to decompose under heat of a laser beam. In an embodiment, the LTHC coating material comprises a base material and carbon black particles in the base material. In an embodiment, the package further includes: a device die; and a die-attach film adhering the device die to the polymer buffer layer, wherein the device die and the die-attach film are encapsulated by the encapsulating material. In an embodiment, the LTHC coating material comprises a first plurality of portions and a second plurality of portions allocated in an alternating layout, and the first plurality of portions are thinner than the second plurality of portions. In an embodiment, the first plurality of portions and the second plurality of portions of the LTHC coating material are parallel strips.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
an encapsulating material;
a through-via extending through the encapsulating material;
a semiconductor die in the encapsulating material;
a Light To Heat Conversion (LTHC) coating material over the encapsulating material and the semiconductor die, the LTHC coating material comprising carbon black particles, wherein the LTHC coating material comprises a first plurality of portions alternating with a second plurality of portions, and wherein a difference in height between a thickness of the first plurality of portions and a thickness of the second plurality of portions is in a range from 0.1 µm to 0.5 µm; and
a first solder region extending through the LTHC coating material.

2. The package according to claim 1, wherein a thickness of the LTHC coating material is at least five times a radius of a first carbon black particle of the carbon black particles.

3. The package according to claim 1, further comprising:
a polymer layer between the LTHC coating material and the semiconductor die, wherein the first solder region further extends through the polymer layer.

4. The package according to claim 1, further comprising:
a die-attach film between the semiconductor die and the LTHC coating material, wherein the semiconductor die and the die-attach film are encapsulated by the encapsulating material.

5. The package according to claim 1, further comprising a redistribution structure electrically connected to the through via and the semiconductor die, wherein the redistribution structure is on an opposing side of the semiconductor die than the LTHC coating material.

6. The package according to claim 5, further comprising a package substrate bonded to the redistribution structure using a second solder region.

7. The package according to claim 1, further comprising a package component bonded to the through-via using the first solder region; and
an underfill disposed around and contacting the first solder region.

8. A package comprising:
a semiconductor die over a redistribution structure;
a through-via adjacent to the semiconductor die;
an encapsulating material surrounding each of the semiconductor die and the through-via;
a Light To Heat Conversion (LTHC) coating material over the encapsulating material and the semiconductor die, the LTHC coating material comprising carbon black particles, wherein a thickness of the LTHC coating material is at least five times a radius of a first carbon black particle of the carbon black particles, wherein the LTHC coating material comprises a first plurality of portions and a second plurality of portions allocated alternatingly, wherein the first plurality of portions are recessed more towards a top surface of the encapsulating material than the second plurality of portions, and wherein each of the first plurality of portions and the second plurality of portions comprises a curved dishing surface; and
a first solder region extending through the LTHC coating material and coupled to the through-via.

9. The package according to claim 8, further comprising a package component coupled to the through-via using the first solder region.

10. The package according to claim 8, wherein a middle portion of the through-via has a width that is smaller than a width of a top portion of the through-via and a width of a bottom portion of the through-via.

11. The package according to claim 8, further comprising a polymer layer disposed between the LTHC coating material and the encapsulating material, and between the LTHC coating material and the semiconductor die.

12. The package according to claim 8, wherein a difference in height between a maximum thickness of the second plurality of portions and a minimum thickness of the first plurality of portions is in a range from 0.1 µm to 0.5 µm.

13. The package according to claim 8, wherein a thickness of the LTHC coating material is in a range from 0.5 µm to 1.5 µm.

14. The package according to claim 8, wherein a width between outermost edges of each of the second plurality of portions is larger than a width between outermost edges of each of the first plurality of portions.

15. A package comprising:
a first package comprising:
a molding compound over a redistribution structure;
a semiconductor die embedded in the molding compound;
a plurality of through-vias extending through the molding compound;
a Light To Heat Conversion (LTHC) coating material over the semiconductor die and the molding compound, wherein the LTHC coating material comprises alternating first strip portions and second strip portions, wherein each of the first strip portions and the second strip portions have top surfaces with dishing shapes; and
first solder regions extending through the LTHC coating material and coupled to respective ones of the plurality of through-vias; and
a second package coupled to the first package using the first solder regions.

16. The package according to claim 15, wherein a difference in height between a maximum thickness of the first strip portions and a minimum thickness of the second strip portions is in a range from 0.1 µm to 0.5 µm.

17. The package according to claim 15, wherein the LTHC coating material comprises conductive particles in a base material, and wherein each of the conductive particles is electrically isolated.

18. The package according to claim 17, wherein the conductive particles comprise carbon black particles, and the base material comprises acrylic.

19. The package according to claim 15, further comprising a package substrate bonded to the redistribution structure using second solder regions.

20. The package according to claim 15, wherein the LTHC coating material is configured to decompose under heat of a laser beam.

* * * * *